United States Patent [19]
Egawa

[11] Patent Number: 5,497,346
[45] Date of Patent: Mar. 5, 1996

[54] SEMICONDUCTOR MEMORY DEVICE

[75] Inventor: Noboru Egawa, Tokyo, Japan

[73] Assignee: Oki Electric Industry Co., Ltd., Tokyo, Japan

[21] Appl. No.: 293,519

[22] Filed: Aug. 19, 1994

[30] Foreign Application Priority Data

Aug. 26, 1993 [JP] Japan .................................. 5-234147

[51] Int. Cl.$^6$ .................................................. G11C 13/00
[52] U.S. Cl. ................................ 365/189.01; 365/230.01
[58] Field of Search ........................ 365/189.01, 189.02, 365/189.03, 51, 189.04, 189.11, 230.01

[56] References Cited

U.S. PATENT DOCUMENTS 4,694,428   9/1987   Matsumura ........................ 365/189.05

OTHER PUBLICATIONS

"Foundation to Practical Application to Memory", by Kazuo Nakamura, published by CQ (issued on May, 1987).

*Primary Examiner*—Terrell W. Fears
*Attorney, Agent, or Firm*—Spencer & Frank

[57] ABSTRACT

An object of the present invention is to provide a semiconductor memory device capable of reducing a delay in the transmission of a chip select signal, which is developed inside a chip and providing very fast access times for chip selection. A chip select terminal to which a chip select signal is externally supplied, is electrically connected to an inner conductive pattern. A first input circuit is disposed as a pre-stage circuit so as to be electrically connected to each of a plurality of inner circuits. The chip select signal supplied to the chip select terminal from the outside of the chip is directly transmitted to each of the first input circuits through the inner conductive pattern so as to be supplied to each of the inner circuits.

23 Claims, 3 Drawing Sheets

15a~15d : FIRST INPUT CIRCUIT A~D

SEMICONDUCTOR MEMORY DEVICE

BACKGROUND OF THE INVENTION

1. Field of the Invention

This invention relates to a semiconductor memory device, and particularly to a semiconductor memory device such as a SRAM (Static Random Access Memory) having a chip select terminal.

2. Description of the Related Art

When a plurality of LSI memories are used in a device which needs mass storage memories, address lines and bus lines are parallel-connected to one another. It is therefore necessary to determine which LSI memory would be selected. Chip select signals are used to discriminate between such memory chips. This process has been disclosed in various references, such as a reference entitled "Foundation to Practical Application to Memory" by Kazuo Nakamura, which has been published by CQ (issued on May 1987).

The present invention to be described later should be understood integrally with these references. The present invention has been made for the purpose of providing a semiconductor memory device capable of reducing a delay in the transmission of a chip select signal, which is developed inside a chip and providing very fast access times for chip selection as compared with semiconductor memory devices disclosed in the references.

SUMMARY OF THE INVENTION

In order to achieve the above object, there is thus provided a semiconductor memory device according to the present invention, having a plurality of inner circuits, comprising a chip select terminal supplied with a chip select signal from the outside, an inner conductive pattern electrically connected to the chip select terminal, and a plurality of first input circuits respectively electrically connected to the plurality of inner circuits, for respectively transmitting the chip select signal sent through the inner conductive pattern to the plurality of inner circuits.

The present application discloses other various embodiments of the invention made to achieve the above object. These embodiments of the invention will be understood from the appended claims, the following description of a preferred embodiment and the accompanying drawings.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENT

Figure 1:
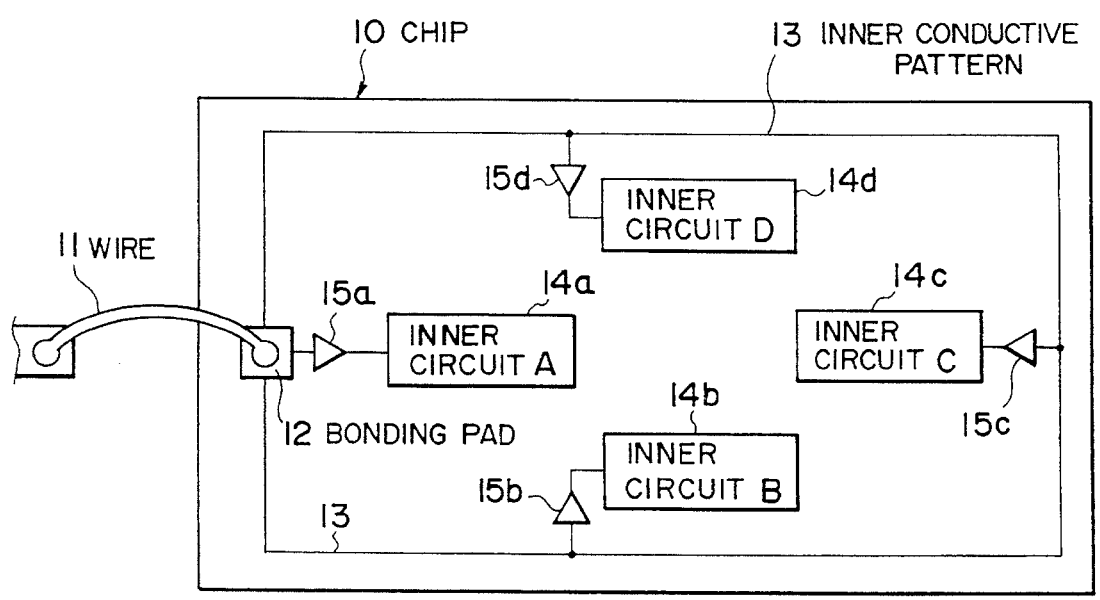
FIG. 1 is a block diagram showing one embodiment of a semiconductor memory device according to the present invention.

A semiconductor memory device (chip 10) showing a preferred embodiment of the present invention comprises a plurality of inner circuits (A through D) 14a through 14d as shown in FIG. 1.

FIG. 1 is a block diagram showing one embodiment of a semiconductor memory device according to the present invention. As shown in the drawing, the chip 10 is constructed in the following manner. A, a chip select signal is supplied to a bonding pad 12 used as a chip select terminal through a wire 11 from the outside of the chip 10. An inner conductive pattern 13 electrically connected to the bonding pad 12 is patterned on the periphery of the chip 10.

Illustrative examples of the inner circuits 14a through 14d incorporated into the chip 10 include an address take-in circuit, a data write circuit, a data read circuit, etc.

Further, each of first input circuits (A through D) 15a through 15d, which serve as pre-stage circuits, is provided in the neighborhood of each of the inner circuits 14a through 14d. The term "neighborhood" is not in the sense of simple electrical connections but in the sense of a physical "neighborhood" in view of a layout. It is thus desirable that the distances between the first input circuits 15a through 15d and their corresponding inner circuits 14a through 14d are set to about 30 µ or less. Incidentally, the distance between the bonding pad 12 and each of the first input circuits 15a through 15d has been assumed to be about 5 mm at the maximum in the present embodiment. It can be understood from this point of view that the distance between one of the first input circuits and its corresponding inner circuit is relatively short (or they are close to each other).

Each of the first input circuits 15a through 15d is used to bi-level convert a chip select signal of a TTL (Transistor-Transistor Logic)level supplied through the wire 11, the bonding pad 12 and the inner conductive pattern 13 from the outside into a signal of a CMOS (Complementary Metal Oxide Semiconductor) level and transmit the converted signal to each of the inner circuits 14a through 14d. Each of the first input circuits 15a through 15d comprises a level converting circuit using an inverter, a NOR circuit, a NAND circuit, or the like.

The operation of the embodiment constructed as described above will now be described.

The chip select signal is input from the outside with a large drive capability and directly transmitted to the entire chip from the bonding pad 12 through the inner conductive pattern 13 so as to be supplied to the first input circuits 15a through 15d.

Since, at this time, the chip select signal is transmitted to the first input circuits 15a through 15d through the inner conductive pattern 13 while it keeps its drive capability, the chip select signal can be transmitted at a high speed without any delay in the transmission of the chip select signal.

Next, the manner in which the semiconductor memory device according to the present invention substantially shortens the delay in the transmission of the chip select signal, which is developed inside the chip, will be described using the inner circuits C (14c, 24c) by way of illustrative example.

Figure 2A:
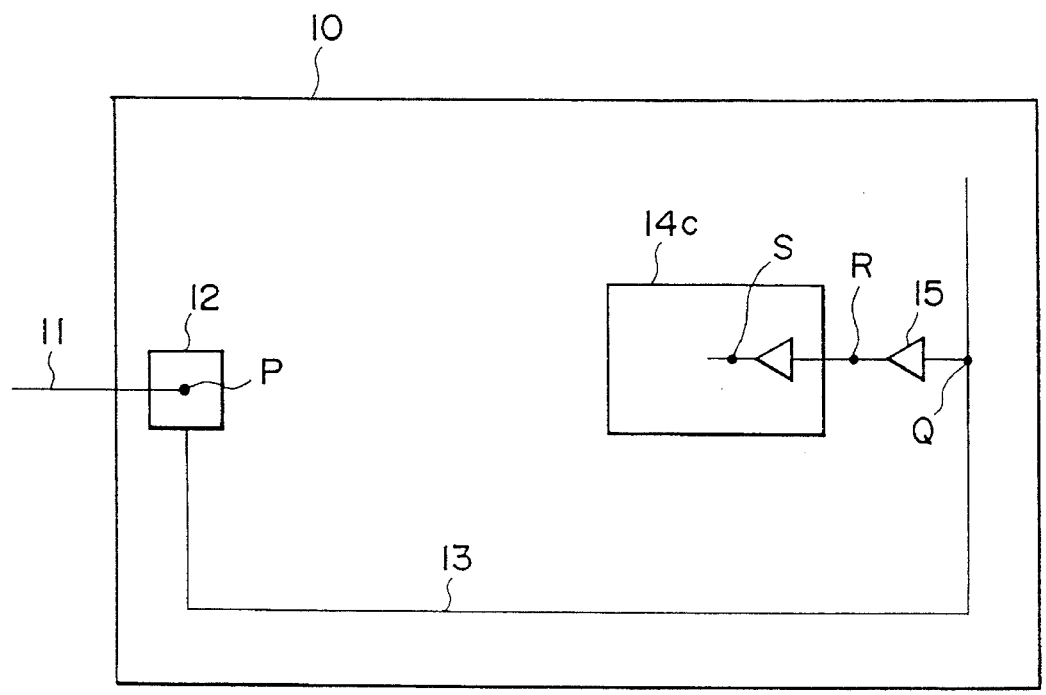
FIGS. 2(a) and 2(b) views are for describing the relationship between a power supply voltage (Vcc) and a transmission time both employed in the semiconductor memory device shown in FIG. 1.
Figure 2B:
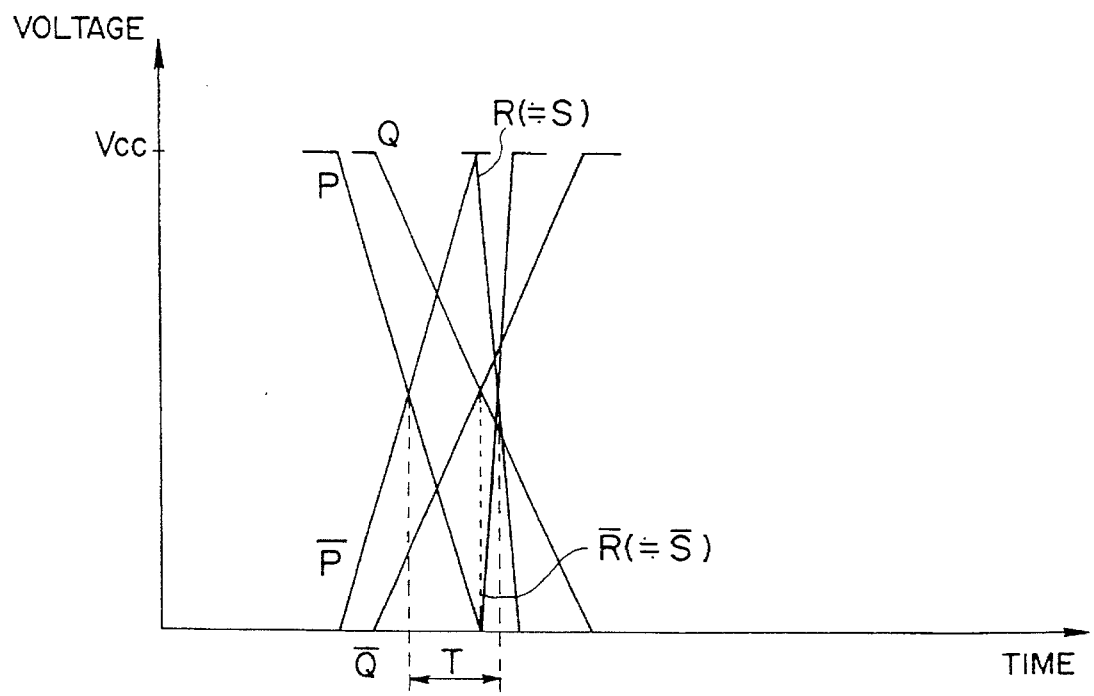
Figure 3A:
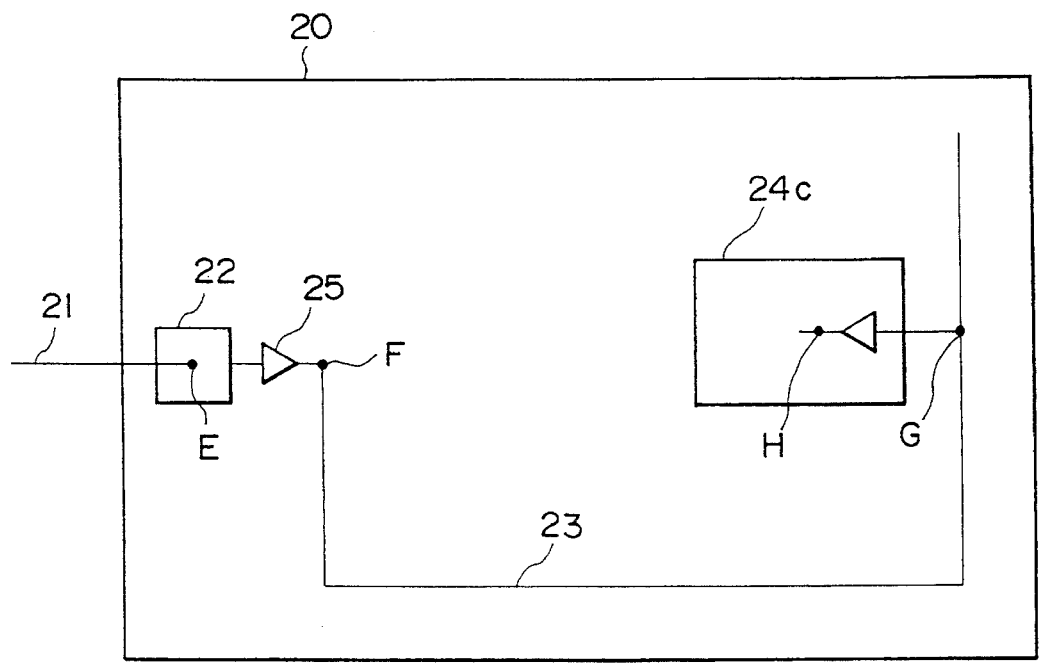
FIGS. 3(a) and 3(b) are views for describing the relationship between a power supply voltage (Vcc) and a transmission time both employed in a conventional semiconductor memory device.
Figure 3B:
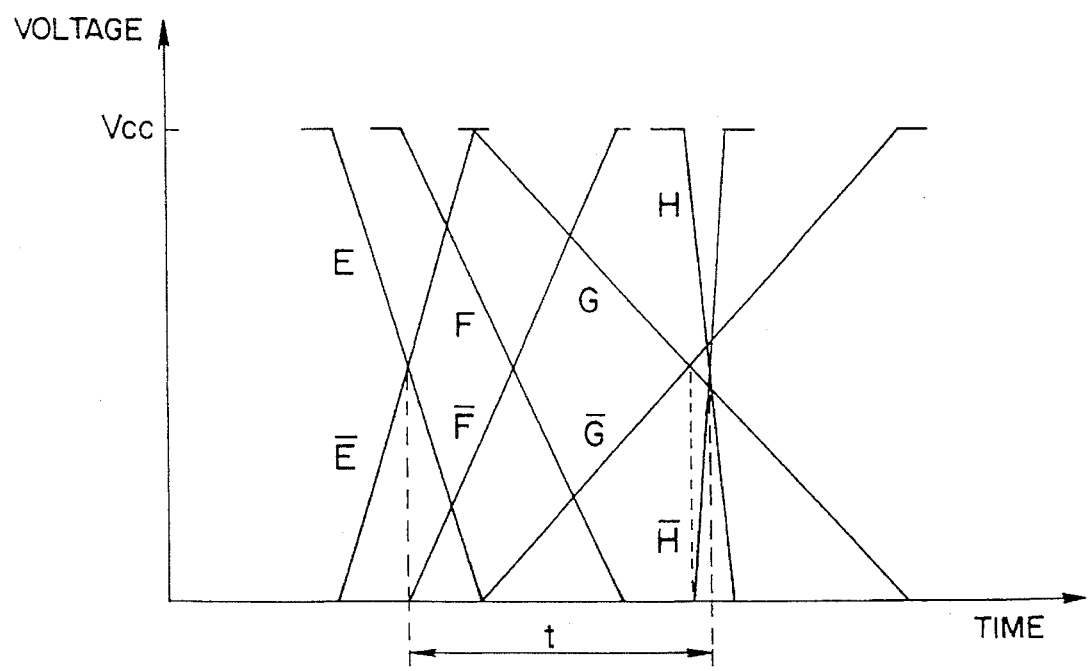

FIG. 2(a) is a view for describing a partial extract of the embodiment of the semiconductor memory device according to the present invention. FIG. 2(b) is a view for describing the relationship between a power supply voltage (Vcc) applied to the inner circuit C (14c) and a transmission time employed in the inner circuit C (14c). FIG. 3(a) is a view for describing a partial extract of a conventional semiconductor memory device. FIG. 3(b) is a view for describing the relationship between a power supply voltage (Vcc) applied to the inner circuit C (24c) and a transmission time employed in the inner circuit C (24c).

A conventional chip 20 is constructed as shown in FIG. 3(a). Namely, a chip select signal is supplied to a bonding pad 22 used as a chip select terminal through a wire 21 from the outside of the chip 20. The chip select signal is converted into a signal of a CMOS level by a first input circuit 25 used as a level converting circuit and the converted signal is supplied to the inner circuit C (24c) through an inner conductive pattern 23. FIG. 3(b) shows the manner of changes in voltages at respective points in the chip 20 and variations in signal transmission times, which are developed depending on the voltage variations. Described specifically, the relationship between a power supply voltage (Vcc) and a transmission time at each of a point E on the bonding pad 22, a point F provided behind the first input circuit 25, a point G provided in the neighborhood of the inner circuit C (24c) and a point H provided behind a level converting circuit in the inner circuit C (24c) is shown in FIG. 3(b).

Further, symbol t shown in FIG. 3(b) represents a time interval required to transmit the chip select signal to the inside of the chip 20. In other words, the symbol t represents a time interval corresponding to a potential from a reference potential (at a point where E and E in FIG. 3(b) intersect) at the point E to a reference potential (at a point where H and H in FIG. 3(b) intersect) at the point H.

Next, consider the chip 10 constructed as shown in FIG. 2(a). A chip select signal is supplied to a bonding pad 12 used as a chip select terminal through a wire 11 from the outside of the chip 10. Thereafter, the signal, which has passed through an inner conductive pattern 13, is converted into a signal of a CMOS level by a first input circuit 15 and the converted signal is supplied to an inner circuit C (14c). FIG. 2(b) shows the manner of changes in voltages at respective points (P, Q, R) in the chip 10 and variations in signal transmission times, which are developed depending on the voltage changes. Since, however, a point S is located exceedingly close to the neighborhood of the point R, the manner of a change in voltage at the point S and a variation in a signal transmission time, which is developed depending on the voltage change, can be handled or considered as being substantially identical to that at the point R.

Symbol T shown in FIG. 2(b) indicates a time interval required to transmit a chip select signal to the inside of the chip 10. That is, the symbol T represents a time interval corresponding to a potential from a reference potential (at a point where P and P in FIG. 2(b) intersect) at the point P to a reference potential (at a point where R and R in FIG. 2(b) intersect) at the point R(S).

As is apparent from the comparison between the times t and T required to transmit the chip select signals to the insides of the chips 20 and 10 as described above, it can be understood that the time required to transmit the chip select signal to the inside of the chip can be substantially shortened by the semiconductor memory device of the present invention.

The chip select signal of the TTL level, which has been transmitted through the inner conductive pattern 13 is bi-level converted into the signal of the CMOS level used as a chip inner signal by each of the first input circuits 15a through 15d. Thereafter, the converted signal is directly input to each of the respective inner circuits 14a through 14d.

Since the first input circuits 15a through 15d are respectively electrically connected to the inner circuits 14a through 14d so as to be disposed in the neighborhoods of the inner circuits 14a through 14d, inner conductive patterns for respectively connecting between the circuits 14a through 14d and the circuits 15a through 15d can be reduced in length. Thus, the degree of influence of their drive capability exerted upon the delay in the transmission of the chip select signal is so low. It is therefore possible to neglect its influence.

The present embodiment describes the semiconductor memory device having the plurality of inner circuits, as an example. However, the present invention is not necessarily limited to or by this embodiment.

Thus, the inner conductive pattern is directly connected to the bonding pad 12 and the first input circuits 15a through 15d are disposed in the neighborhoods of their corresponding inner circuits 14a through 14d. Further, the chip select signal supplied to the bonding pad 12 from the outside of the chip is directly transmitted to each of the first input circuits 15a through 15d through the inner conductive pattern 13 so as to be supplied to each of the inner circuits 14a through 14d. As a result, the chip select signal can be sent to each of the first input circuits 15a through 15d through the inner conductive pattern 13 while the chip select signal keeps its drive capability. Therefore, the chip select signal can be transmitted at a high speed without any delay in the transmission of the chip select signal, which is developed inside the chip.

Thus, access times for chip selection can be rendered faster.

According to the semiconductor memory device of the present invention, as has been described above in detail, an inner conductive pattern is directly connected to a bonding pad used as a chip select terminal and patterned onto a chip. Further, a plurality of first input circuits are respectively disposed in the neighborhoods of a plurality of inner circuits as pre-stage circuits and a chip select signal input from the outside of the chip is directly transmitted to each of the first input circuits through the inner conductive pattern. Thus, a delay in the transmission of the chip select signal, which is developed inside the chip, can be substantially shortened and the chip select signal can be transmitted at a high speed. It is therefore possible to make access times for chip selection faster.

While the present invention has been described with reference to the illustrative embodiment, this description is not intended to be construed in a limiting sense. Various modifications of the illustrative embodiment, as well as other embodiments of the invention, will be apparent to those skilled in the art on reference to this description. It is therefore contemplated that the appended claims will cover any such modifications or embodiments as fall within the true scope of the invention.

What is claimed is:

1. A semiconductor memory device having at least one inner circuit, the device comprising:

a chip select terminal for receiving a chip select signal from outside the device;

an inner conductive pattern, directly electrically connected to said chip select terminal, for carrying the chip select signal; and at least one first input circuit, directly electrically connected to said inner conductive pattern and to said at least one inner circuit, for transmitting the chip select signal carried by said inner conductive pattern to said at least one inner circuit.

2. A semiconductor memory device according to claim 1, wherein the chip select signal is a TTL level signal, and wherein said at least one first input circuit comprises a level converting circuit for bi-level converting the TTL level chip select signal carried by said inner conductive pattern into a CMOS level signal and for transferring the CMOS level signal to said at least one inner circuit.

3. A semiconductor memory device according to claim 2, wherein said level converting circuit comprises a NOR circuit.

4. A semiconductor memory device according to claim 2, wherein said level converting circuit comprises a NAND circuit.

5. A semiconductor memory device according to claim 2, wherein said level converting circuit comprises an inverter.

6. A semiconductor memory device according to claim 1, wherein the chip select signal received from outside of the device has a predefined drive capability, and wherein the inner conductive pattern has electrical characteristics such that the chip select signal is carried by said inner conductive pattern to said at least one first input circuit while maintaining the predefined drive capability.

7. A semiconductor memory device according to claim 1, wherein said chip select terminal comprises a bonding pad.

8. A semiconductor memory device having at least one inner circuit, the device comprising:

a chip select terminal for receiving a chip select signal from outside the device;

an inner conductive pattern, directly electrically connected to said chip select terminal, for carrying the chip select signal; and at least one first input circuit, disposed in the immediate neighborhood of said at least one inner circuit and directly electrically connected to said inner conductive pattern and to said at least one inner circuit, for transmitting the chip select signal carried by said inner conductive pattern to said at least one inner circuit.

9. A semiconductor memory device according to claim 8, wherein the chip select signal is a TTL level signal, and wherein said at least one first input circuit comprises a level converting circuit for bi-level converting the TTL level chip select signal carried by said inner conductive pattern into a CMOS level signal and for transmitting the CMOS level signal to said at least one inner circuit.

10. A semiconductor memory device according to claim 9, wherein said level converting circuit comprises a NOR circuit.

11. A semiconductor memory device according to claim 9, wherein said level converting circuit comprises a NAND circuit.

12. A semiconductor memory device according to claim 9, wherein said level converting circuit comprises an inverter.

13. A semiconductor memory device according to claim 8, wherein the chip select signal received from outside of the device has a predefined drive capability, and wherein the inner conductive pattern has electrical characteristics such that the chip select signal is carried by said inner conductive pattern to said at least one first input circuit while maintaining the predefined drive capability.

14. A semiconductor memory device according to claim 8, wherein said chip select terminal comprises a bonding pad.

15. A semiconductor memory device according to claim 8, wherein the at least one first input circuit is disposed in the immediate neighborhood of said at least one inner circuit such that a distance between said at least one inner circuit and said at least one first input circuit is not greater than approximately 30 μ.

16. A semiconductor memory device having a plurality of inner circuits, the device comprising:

a chip select terminal for receiving a chip select signal from outside the device;

an inner conductive pattern, directly electrically connected to said chip select terminal, for carrying the chip select signal; and a plurality of first input circuits, of a number corresponding to the plurality of inner circuits, each first input circuit being disposed in the immediate neighborhood of and being respectively directly electrically connected to a respective corresponding one of said plurality of inner circuits, each first input circuit for respectively transmitting the chip select signal carried by said inner conductive pattern to a respective corresponding one of said plurality of inner circuits.

17. A semiconductor memory device according to claim 16, wherein the chip select signal is a TTL level signal, and wherein each of said plurality of first input circuits comprises a level converting circuit for respectively bi-level converting the TTL level chip select signal carried by said inner conductive pattern into a CMOS level signal and for transmitting the CMOS level signal to a respective corresponding one of said plurality of inner circuits.

18. A semiconductor memory device according to claim 17, wherein said level converting circuits comprise NOR circuits.

19. A semiconductor memory device according to claim 17, wherein said level converting circuits comprise NAND circuits.

20. A semiconductor memory device according to claim 17, wherein said level converting circuits comprise inverters.

21. A semiconductor memory device according to claim 16, wherein the chip select signal received from outside of the device has a predefined drive capability, and wherein the inner conductive pattern has electrical characteristics such that the chip select signal is transmitted to said first input circuits while maintaining the predefined drive capability.

22. A semiconductor memory device according to claim 16, wherein said chip select terminal comprises a bonding pad.

23. A semiconductor memory device according to claim 16, wherein each respective one of said plurality of inner circuits is disposed in the immediate neighborhood of a corresponding respective input circuit such that a distance between each one of said plurality of first input circuits and a respective corresponding one of said plurality of inner circuits is not greater than approximately 30 μ.

* * * * *